United States Patent
Wu et al.

(10) Patent No.: US 11,152,357 B2
(45) Date of Patent: Oct. 19, 2021

(54) RECTIFIER DIODE ENCAPSULATION STRUCTURE WITH COMMON ELECTRODES

(71) Applicant: ZHANGZHOU GO WIN LIGHTING CO., LTD, Zhangzhou (CN)

(72) Inventors: Qingan Wu, Zhangzhou (CN); Xiongzhong Lin, Zhangzhou (CN)

(73) Assignee: ZHANGZHOU GO WIN LIGHIING CO., LTD, Zhangzhou (CN)

( * ) Notice: Subject to any disclaimer, the term of this patent is extended or adjusted under 35 U.S.C. 154(b) by 0 days.

(21) Appl. No.: 16/880,975

(22) Filed: May 21, 2020

(65) Prior Publication Data
US 2021/0210486 A1 Jul. 8, 2021

(30) Foreign Application Priority Data
Jan. 8, 2020 (CN) .......................... 202020034215.6

(51) Int. Cl.
| | |
|---|---|
| *H01L 27/08* | (2006.01) |
| *H01L 23/31* | (2006.01) |
| *H05B 45/3725* | (2020.01) |

(52) U.S. Cl.
CPC ...... *H01L 27/0814* (2013.01); *H01L 23/3157* (2013.01); *H05B 45/3725* (2020.01); *H01L 23/3107* (2013.01)

(58) Field of Classification Search
None
See application file for complete search history.

(56) References Cited

U.S. PATENT DOCUMENTS

| | | | | |
|---|---|---|---|---|
| 7,265,496 | B2* | 9/2007 | Allen | F21S 41/00 315/185 R |
| 7,609,006 | B2* | 10/2009 | Gibboney | F21S 4/20 315/200 R |
| 10,079,553 | B1* | 9/2018 | Chen | H01L 23/49558 |
| 2005/0110426 | A1* | 5/2005 | Shao | H05B 45/30 315/185 R |
| 2007/0131942 | A1* | 6/2007 | Yen | H05B 45/40 257/79 |
| 2008/0106212 | A1* | 5/2008 | Yen | H05B 45/30 315/192 |
| 2008/0218098 | A1* | 9/2008 | Lee | H05B 45/37 315/250 |

(Continued)

*Primary Examiner* — Andres Munoz

(57) ABSTRACT

A rectifier diode encapsulation structure with common electrodes, comprises an encapsulation assembly with common electrodes, the encapsulation assembly with common electrodes comprises an encapsulation with a common anode and an encapsulation with a common cathode; the encapsulation with the common anode and the encapsulation with the common cathode both comprise two rectifier diodes and a encapsulation body covering outside of the rectifier diodes, and the encapsulation body is provided with three pins, in the encapsulation with a common anode one of the pins is electrically connected to the anode of the two rectifier diodes, the other two pins are electrically connected to the cathodes of the two rectifier diodes one-to-one respectively. The disclosure reduces the volume of the encapsulation by separating the traditional rectifier components, saves materials, reduces costs and makes the application more flexible.

4 Claims, 1 Drawing Sheet

(56) References Cited

U.S. PATENT DOCUMENTS

2011/0260305 A1* 10/2011 Saboco .................. H01L 24/49
  257/670
2013/0075891 A1* 3/2013 Huang .............. H01L 23/49575
  257/737

* cited by examiner

RECTIFIER DIODE ENCAPSULATION STRUCTURE WITH COMMON ELECTRODES

CROSS REFERENCE TO RELATED APPLICATIONS

This application claims all benefits accruing under 35 U.S.C. § 119 from China Patent Application No. 202020034215.6, filed on Jan. 8, 2020, in the State Intellectual Property Office of China, the disclosure of which is incorporated herein by reference in its entirety.

TECHNICAL FIELD

The disclosure relates to the field of semiconductor electronics, and and more particularly to a rectifier diode encapsulation structure with common electrodes.

BACKGROUND

LED illumination has become a mainstream illumination mode in the world today because of its high luminous efficiency, more energy-saving and longer lifetime than a conventional illumination mode.

In general, when a LED light bulb in a lighting device is used, a rectifier component is needed to convert alternating current into direct current in a circuit, so that the lighting requirement of the LED light bulb can be satisfied. Currently, the main way to rectify LED circuits is to use full-bridge rectifier components to convert alternating current power in the power grid into an appropriate current or voltage source, thereby driving the LED beads to emit light. However, a full-bridge rectifier assembly composed of diodes generally has a large volume, and cannot be flexibly applied to various scenarios, and a protective shell is need to be welded externally, and welding is relatively troublesome. Although an integrated bridge stack has a small volume, the integrated bridge stack cannot be used without splitting, and when it is required to extend the distance between the anode and cathodes, longer wires is needed, which results in increased costs.

The object of the disclosure is to design a rectifier diode encapsulation structure with common electrodes to solve the problem existing in the prior art.

SUMMARY OF DISCLOSURE

In view of the above problems existing in the prior art, the disclosure is to provide a rectifier diode encapsulation structure with common electrodes, which has a wide application range, can save material cost, improve production efficiency, and can effectively solve the above problems existing in the prior art.

The technical solution of the disclosure is:

A rectifier diode encapsulation structure with common electrodes, comprising an encapsulation assembly with common electrodes, wherein the encapsulation assembly with common electrodes comprises an encapsulation with a common anode and an encapsulation with a common cathode; the encapsulation with the common anode and the encapsulation with the common cathode both comprise two rectifier diodes and an encapsulation body covering outside of the rectifier diodes, and the encapsulation body is provided with three pins.

Further, in the encapsulation with the common anode one of the pins is electrically connected to the anode of the two rectifier diodes, the other two pins are electrically connected to the cathodes of the two rectifier diodes one-to-one respectively.

Further, in the encapsulation with the common cathode one of the pins is electrically connected to the cathode of the two rectifier diodes, the other two pins are electrically connected to the anodes of the two rectifier diodes one-to-one respectively.

Further, the encapsulation is a resin encapsulation.

The technical solution has the following technical effects:

The rectifier diode encapsulation structure with common electrodes of the disclosure divides the conventional full bridge rectifier assembly into two parts, that is the encapsulation with the common anode and the encapsulation with the common cathode, which not only reduces the encapsulation volume, enables the encapsulation to be flexibly applied in various narrow scenes, and has a wider application range. Furthermore, the the encapsulation with the common anode and the encapsulation with the common cathode have a smaller encapsulation volume, which can save material and reduce costs. Meanwhile, when the encapsulation with the common anode and the encapsulation with the common cathode are used in cooperation with a device such as a lamp string, it is only necessary to connect the encapsulation with the common anode and the encapsulation with the common cathode to the anode and cathode of the device respectively, and the wiring is relatively convenient and simplified, thereby reducing the wiring cost.

Figure 1:
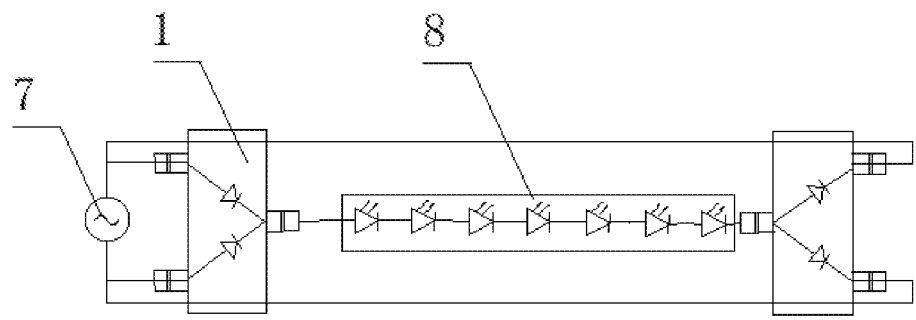
FIG. 1 is a schematic structural diagram of the disclosure.

Attached Items: encapsulation assembly with common electrodes 1; encapsulation with the common cathode 2; encapsulation with the common cathode 3; a rectifier diode 4; encapsulation body 5; pin 6; an alternating current power supply 7; LED lamp string 8.

DETAILED DESCRIPTION

Figure 2:
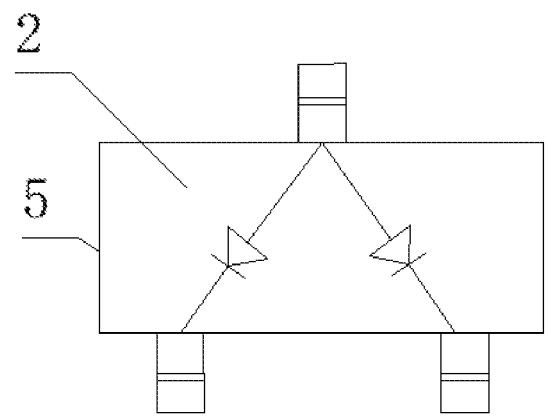
FIG. 2 is a schematic structural diagram of a encapsulation with the common anode.
Figure 3:
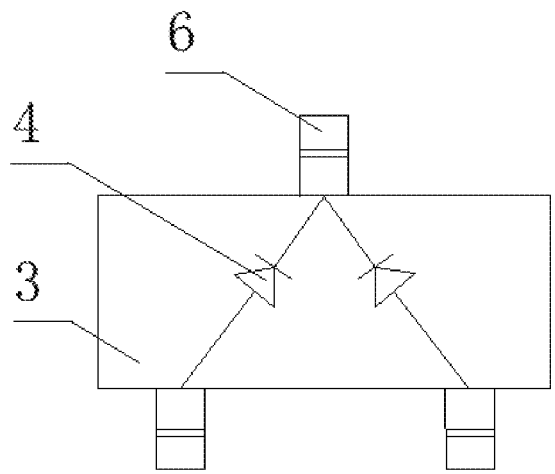
FIG. 3 is a schematic structural diagram of a encapsulation with the common cathode.

In order to facilitate the understanding of those skilled in the art, the structure of the disclosure will now be described in detail with reference to the accompanying drawings:

In one embodiment of the disclosure, referring to FIGS. 1-3, a rectifier diode encapsulation structure with common electrodes comprises an encapsulation assembly with common electrodes 1, where the encapsulation assembly with common electrodes 1 comprises an encapsulation with a common anode 2 and an encapsulation with a common cathode 3. The encapsulation with the common anode 2 and the encapsulation with the common cathode 3 both comprise two rectifier diodes 4 and an encapsulation body 5 covering outside of the rectifier diodes 4, and the encapsulation body 5 is provided with three pins 6. In the present embodiment, the encapsulation assembly with common electrodes 1 is composed of the encapsulation with the common anode 2 and the encapsulation with the common cathode 3. The encapsulation with the common anode 2 and the encapsulation with the common cathode 3 are respectively composed of two rectifier diodes 4 and the encapsulation body 5. Compared with the conventional full bridge rectifier assembly, it has a smaller volume, therefore has a wider applicable scene range, when applied to other devices, for example, the LED lamp string 8. The LED lamp string 8 is disposed between the encapsulation with the common anode 2 and the encapsulation with the common cathode 3. The wiring can be simplified, thus, the wiring cost is reduced.

Specifically, referring to FIG. 2, in the encapsulation with the common anode 2, one of the pins 6 is electrically connected to the anodes of the two rectifier diodes 4, and the remaining two pins 6 are electrically connected to the cathodes of the two rectifier diodes 4 in a one-to-one manner. In the present embodiment, when the encapsulation with the common anode 2 is connected to an external device, it is only necessary to connect the pins 6 connected to the anode of the rectifier diode 4 with the device, and the remaining two pins 6 are respectively connected to two ends of the alternating current power source 7, which is convenient and simple, thereby effectively improving production efficiency.

Specifically, referring to FIG. 3, in the encapsulation with the common cathode 3, one of the pins 6 is electrically connected to the cathode of the two rectifier diodes 4, and the remaining two pins 6 are electrically connected to the anodes of the two rectifier diodes 4 in a one-to-one manner. In this embodiment, when the encapsulation with the common cathode 3 is connected to an external device, it is only necessary to connect the pins 6 connected to the cathode of the rectifier diode 4 with the device, and the remaining two pins 6 are respectively connected to two ends of the alternating current power source 7, which is convenient and simple, thereby effectively improving production efficiency.

Specifically, the encapsulation body 5 is a resin encapsulation. In the present embodiment, the resin encapsulation has not only a small volume, but also can make the internal electronic component have a strong resistance to external force, extending the service life of the apparatus.

Embodiment 1

Referring to FIG. 1, when the encapsulation assembly with common electrodes 1 and the LED lamp string 8 of the disclosure are used in cooperation, the encapsulation with the common cathode 3, the LED lamp string 8 and the encapsulation with the common anode 2 can be connected in sequence, wherein the encapsulation with the common cathode 3 is connected to the pin 6 connected to the cathode of the two rectifier diodes 4, the encapsulation with the common anode 2 is connected to the pin 6 connected to the anode of the two rectifier diodes 4, and the encapsulation with the common cathode 3 and the encapsulation with the common anode 2 are connected to the anode and cathode of the LED lamp respectively. The remaining two pins 6 of the encapsulation with a common anode 2 and the encapsulation with the common cathode 3 are connected to the alternating current power supply 7 in parallel, so as to rectify the power supply.

The above are merely preferred embodiment of the disclosure, and all equivalent changes and modifications made according to the patent scope of the disclosure should belong to the scope of coverage of the disclosure.

What is claimed is:

1. An LED lamp string device having a rectifier diode encapsulation structure with common electrodes, consists of:
    an LED lamp string; and
    an encapsulation assembly with common electrodes; wherein
        the encapsulation assembly with common electrodes includes an encapsulation with a common anode and an encapsulation with a common cathode;
        the encapsulation with the common anode and the encapsulation with the common cathode both include two rectifier diodes and an encapsulation body covering an outside of the two rectifier diodes, and the encapsulation body is provided with three pins, a first pin of the encapsulation with the common cathode connected to a cathode of the two rectifier diodes and a first pin of the encapsulation with the common anode connected to an anode of the two rectifier diodes are connected to an anode and a cathode of the LED lamp string respectively, a second pin and a third pin of the encapsulation with the common anode and a second pin and a third pin of the encapsulation with the common cathode are connected to an alternating current power supply in parallel.

2. The LED lamp string device having the rectifier diode encapsulation structure with common electrodes according to claim 1, wherein in the encapsulation with the common anode, the first pin is electrically connected to the anode of the two rectifier diodes, and the second pin and third pin are electrically connected to the cathodes of the two rectifier diodes respectively.

3. The LED lamp string device having the rectifier diode encapsulation structure with common electrodes according to claim 1, wherein in the encapsulation with the common cathode, the first pin is electrically connected to the cathode of the two rectifier diodes, and the second pin and third pin are electrically connected to the anodes of the two rectifier diodes respectively.

4. The LED lamp string device having the rectifier diode encapsulation structure with common electrodes according to claim 1, wherein the encapsulation body is a resin encapsulation.

* * * * *